US007454298B2

(12) United States Patent
Roal et al.

(10) Patent No.: US 7,454,298 B2
(45) Date of Patent: Nov. 18, 2008

(54) APPARATUS AND METHOD FOR IDENTIFYING ELECTRICAL FAULTS

(75) Inventors: James A. Roal, Chillicothe, IL (US); Mark J. Hilbert, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 131 days.

(21) Appl. No.: 11/495,566

(22) Filed: Jul. 31, 2006

(65) Prior Publication Data

US 2008/0059087 A1    Mar. 6, 2008

(51) Int. Cl.
G06F 15/00 (2006.01)
(52) U.S. Cl. ....................................................... 702/58
(58) Field of Classification Search .................... 702/58, 702/59–64, 182–185, 188
See application file for complete search history.

(56) References Cited

U.S. PATENT DOCUMENTS

| 4,924,398 | A  |   | 5/1990  | Fujiwara         |
|-----------|----|---|---------|------------------|
| 5,043,655 | A  |   | 8/1991  | Anholm, Jr. et al. |
| 5,050,080 | A  |   | 9/1991  | Abe              |
| 5,365,438 | A  | * | 11/1994 | Mitchell et al. ................ 701/31 |
| 5,783,821 | A  |   | 7/1998  | Costello, Jr.    |
| 6,192,302 | B1 |   | 2/2001  | Giles et al.     |
| 6,341,358 | B1 |   | 1/2002  | Bagg et al.      |
| 6,344,748 | B1 |   | 2/2002  | Gannon           |
| 6,477,478 | B1 |   | 11/2002 | Jones et al.     |

* cited by examiner

Primary Examiner—Edward Raymond
(74) Attorney, Agent, or Firm—Finnegan, Henderson, Farabow, Garrett & Dunner

(57) ABSTRACT

A method of identifying an electrical fault in an electrical system may include coupling an electronic service tool to an electronic control module. The method may also include instructing the electronic control module to disable an enable condition and modify a trip condition set by the electronic control module. The method may further include monitoring the electrical system as a user wiggles a component of the electrical system. The method may further include providing the electronic control module with electrical system data, and generating a fault code when the electrical system data fulfills the modified trip condition. The method may further include communicating the fault code to the user.

20 Claims, 5 Drawing Sheets

APPARATUS AND METHOD FOR IDENTIFYING ELECTRICAL FAULTS

TECHNICAL FIELD

The present disclosure relates generally to testing electrical systems, and more particularly to an apparatus and method for identifying electrical faults in electrical systems.

BACKGROUND

Machines, such as, for example, on-highway vehicles, off-highway vehicles, engines, and generators, may include electronic control systems having one or more electronic control units, sensors, and actuators. The electronic control systems and related electrical components may be interconnected using a network of conductors and electrical connectors to form one or more circuits.

Over time, the electrical devices, wires, and connectors may break, causing discontinuities to appear in the circuits. The discontinuities, sometimes referred to as "hard faults," may inhibit or prevent electrical current from reaching portions of the electrical system. The lack of current may result in a degradation in machine performance or total machine failure. Even if the electrical devices, wires, and connectors do not completely break, they may still experience intermittent faults caused by such things as wear, machine vibration, chafing at electrical terminals, and entry of moisture into the electrical system. Unlike hard faults, intermittent faults may appear and then disappear, and sometimes, may appear for only fractions of a second. Additionally, intermittent faults may occur seemingly at random. For these reasons, intermittent faults may be more difficult to identify and diagnose than hard faults. Furthermore, some diagnostic devices used for diagnosing and identifying hard faults may characterize intermittent faults as false errors, and accordingly, intermittent faults may be ignored or overlooked.

At least one system has been developed for diagnosing machine electrical systems. For example, U.S. Pat. No. 6,477,478 to Jones et al. ("Jones") discloses an apparatus, which comprises a base station and a handset, used for vehicle testing. The handset is adapted to carry out a test sequence under the control of the base station. A test sequence performed using the apparatus includes shaking the vehicle or starting and stopping the vehicle's engine several times. Significant variations in measurements indicate intermittent problems and their severity. The starting and stopping of the engine, however, may cause vibrations in the vehicle's electrical system. The vibrations may cause intermittent faults to appear simultaneously in multiple areas of the electrical system, thus making the separate identification of each intermittent fault more difficult. Failing to particularly identify intermittent faults may result in unnecessary repairs. Also, if an intermittent fault prevents the engine from starting in the first place, then the test sequence may fail to execute properly. Furthermore, shaking the vehicle may require a great deal of effort, while also increasing the likelihood of causing damage to other components of the vehicle.

The disclosed apparatus is directed to overcoming one or more of the problems set forth above.

SUMMARY OF THE INVENTION

In one aspect, the presently disclosed embodiments may be directed to an apparatus for identifying an electrical fault in an electrical system. The apparatus may include an electronic service tool. The electronic service tool may be configured to instruct an electronic control module to disable an enable condition and modify a trip condition set by the electronic control module. The electronic service tool may also be configured to receive electrical system data from the electronic control module as a user wiggles a component of the electrical system. The electronic service tool may be further configured to communicate a fault code to the user when electrical system data fulfills the modified trip condition.

In another aspect, the presently disclosed embodiments may be directed to a method of identifying an electrical fault in an electrical system. The method may include coupling an electronic service tool to an electronic control module. The method may also include instructing the electronic control module to disable an enable condition and modify a trip condition set by the electronic control module. The method may further include monitoring the electrical system as a user wiggles a component of the electrical system. The method may further include providing the electronic control module with electrical system data, and generating a fault code when the electrical system data fulfills the modified trip condition. The method may further include communicating the fault code to the user.

In yet another aspect, the presently disclosed embodiments may be directed to a method of reconfiguring an on-board diagnostics system to identify electrical faults in an electrical system of a machine. The method may include switching the on-board diagnostics system from a normal test mode into a wiggle test mode using an electronic service tool. In the normal test mode, the on-board diagnostics system may set an enable condition and a trip condition to identify a hard fault in the electrical system. When the electronic service tool switches the on-board diagnostics system into the wiggle test mode, the enable condition may be disabled and the trip condition may be modified to identify an intermittent fault in the electrical system.

DETAILED DESCRIPTION

Exemplary embodiments of the present disclosure are illustrated in the accompanying drawings. Wherever possible, the same reference numbers will be used throughout the drawings to refer to the same or like parts.

Figure 1:
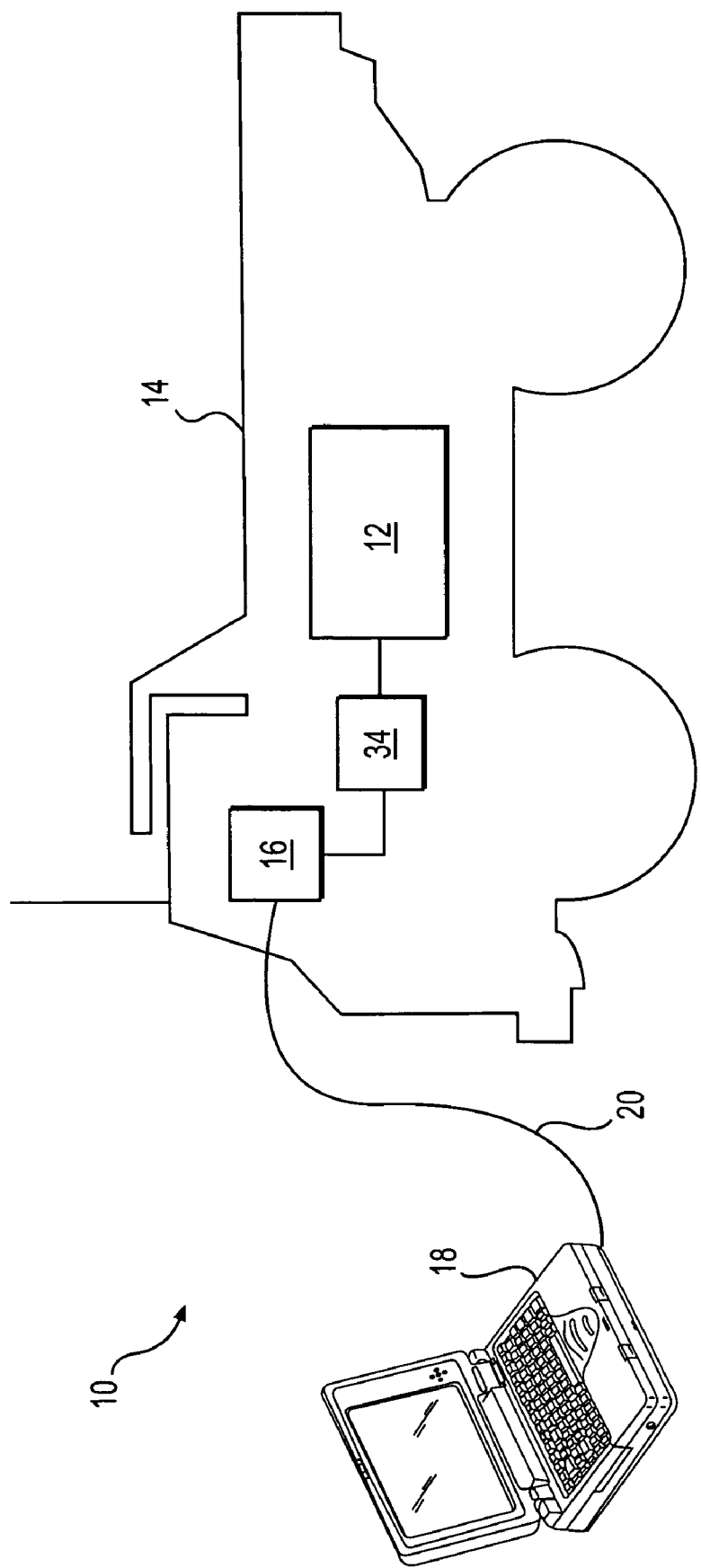
FIG. 1 is an illustration of an apparatus for identifying electrical faults according to an exemplary disclosed embodiment of the present disclosure.

An apparatus 10 for identifying electrical faults in an electrical system 12 of a machine 14 is shown in FIG. 1 of the drawings. Apparatus 10 may include, for example, an electronic control module 16 that may be operatively connected to an electronic service tool 18 by an interlock 20.

Figure 2:
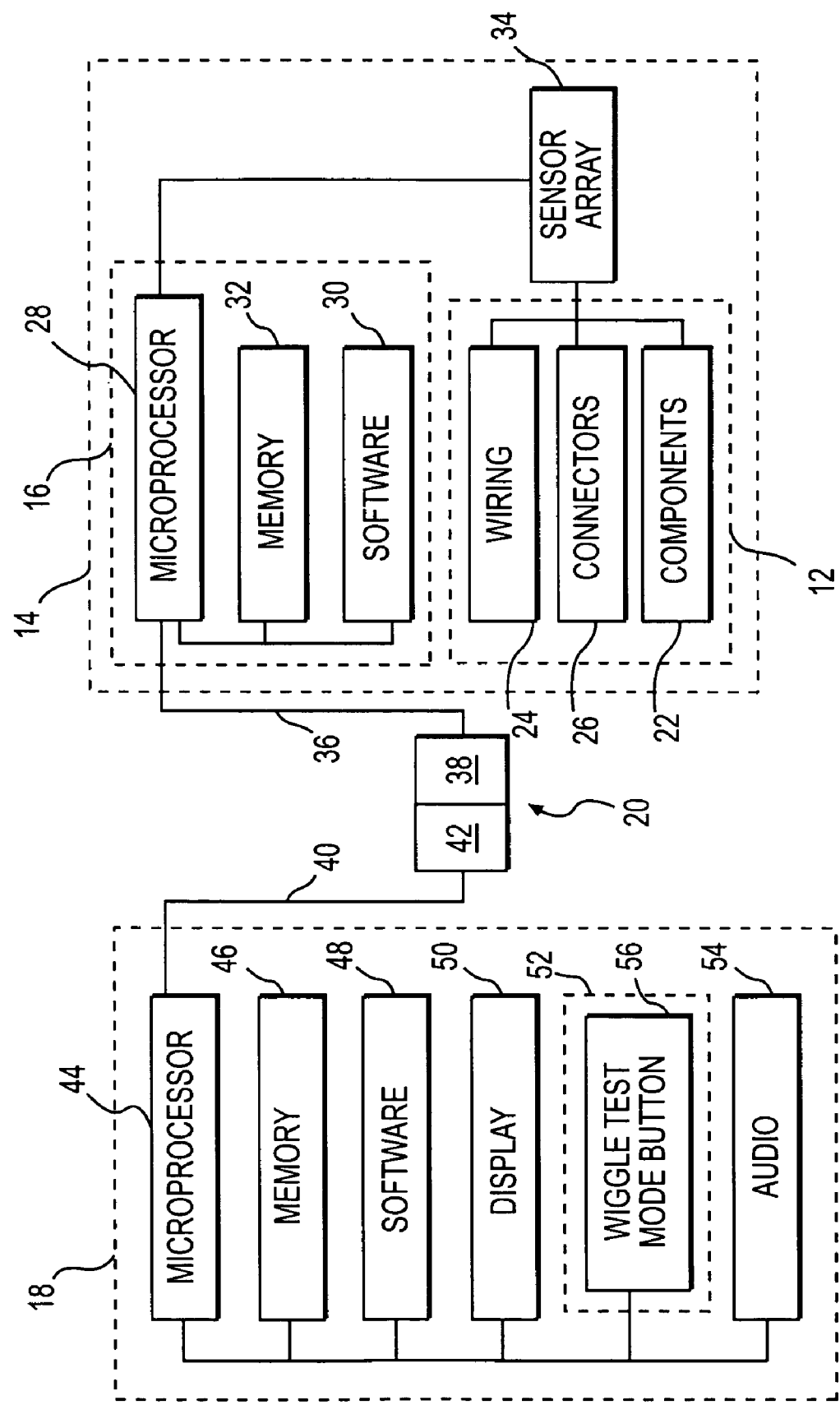
FIG. 2 is a schematic illustration of an apparatus for identifying electrical faults according to an exemplary disclosed embodiment of the present disclosure.

Machine 14, shown schematically in FIG. 2, may include, for example, an on-highway vehicle, an off-highway vehicle, an engine assembly, and a generator. Electrical system 12 may be configured to generate, store, and distribute electrical power in machine 14. In one embodiment, electrical system 12 may be part of a larger electronic control system (not shown) of machine 14. Electrical components 22 of machine 14 may include, for example, one or more additional electronic control modules, sensors, actuators, and/or other electrical devices (not shown). Electrical components 22 may be connected to electronic control module 16 and other electrical components by a network of wiring 24 and electrical connectors 26, forming one or more circuits.

Wiring 24 may include single solid conductors or a stranded group of conductors, such as one or more bundles of wires or wiring harnesses, having a relatively low resistance to current flow. Electrical connectors 26 may include devices for joining wiring 24, electrical components 22, or entire circuits. Electrical connectors 26 may provide electrical connections that may be relatively easily established and separated, but may also facilitate more permanent electrical connections.

Electronic control module 16 may be configured to communicate with components of machine 14 and to control their operation. Electronic control module 16 may include a microprocessor 28 for running software 30 and performing other computing functions, and may also include memory 32 for storing information. Software 30 may include written programs, procedures, and/or instructions for electronic control module 16. Software 30 may include, for example, fault diagnosis software having diagnostic algorithms for detecting faults and/or shorts in electrical system 12. The diagnostic algorithms may run at task rates that may provide near-instantaneous feedback on the state of electrical system 12. The task rate may be selectively adjusted based on the application. It is contemplated that machine 14 may include a plurality of electronic control modules (not shown) for its different components.

Electrical system 12 may include, or may be coupled to, one or more sensor arrays 34. Additionally or alternatively, electrical system 12 may be operatively connected to a sensor array 34. Sensor array 34 may include one or more sensors (not shown) placed in various locations throughout machine 14. Using sensor array 34, electronic control module 16 may monitor, diagnose, and identify malfunctions or breakages in machine 14. Sensor array 34 may also be configured to sense parameters and operating conditions of machine components, and information obtained from sensor array 34 may be reported to electronic control module 16.

While running the fault diagnosis software, one of the tasks electronic control module 16 may perform is to sense, analyze, and interpret information regarding sensor array 34, other electronic control modules, sensors, and/or actuators (not shown). Electronic control module 16 may store that information in its memory 32, and/or send that information to other sources when prompted to do so. The fault diagnosis software may include predetermined enable conditions and trip conditions. Enable conditions may include baseline conditions that must be met before electronic control module 16 will run the diagnostic algorithms on electrical system 12 to identify whether any trip conditions have been met. By setting baseline or enable conditions for triggering execution of the diagnostic algorithms, the reporting of false errors by electronic control module 16 may be reduced. If the enable conditions are satisfied, electronic control module 16 may attempt to identify faults in electrical system 12 by using the diagnostic algorithms to analyze information and determine whether any trip conditions have been fulfilled.

A trip condition may include a single requirement or a set of multiple requirements that must be satisfied by an element of electrical system 12 in order for electronic control module 16 to recognize that the element is causing a fault or short. A trip condition may include a trip threshold, such as, for example, a current value, voltage value, temperature value, or any other suitable value pertaining to the element. Additionally, the trip condition may include a duration requirement or trip delay. When a trip condition is satisfied, electronic control module 16 may generate a fault code identifying the fault or short causing the trip condition.

For example, a trip condition set in electronic control module 16 may require that a voltage in a sensor, actuator, or other electrical component, must exceed 4.95 V for ten seconds in order for the trip condition to be fulfilled. The duration requirement of ten seconds may be an example of a trip delay designed to help reduce the reporting of false errors by electronic control module 16. If electronic control module 16 senses that the voltage in the sensor, actuator, or other electrical component has been above 4.95 V for at least ten seconds (thus fulfilling the trip condition), then the electronic control module 16 may trip, recognizing the presence of a hard fault or short in the portion of electrical system 12 being monitored by electronic control module 16.

When electronic control module 16 recognizes the existence of a hard fault or short in wiring 24, electrical connectors 26, electrical components 22, or sensor array 34, it may generate a corresponding fault code. A fault code may contain information describing the time, location, or duration of the hard fault or short. The fault code may also contain any other suitable descriptive information related to the occurrence of the hard fault or short. The fault code may be stored in memory 32 in a fault log or similar record.

Interlock 20 may include any suitable device or mechanism for connecting electronic control module 16 to electronic service tool 18. In one embodiment, interlock 20 may be a cable 36 that may be connected on its first end to electronic control module 16. A second end of cable 36 may include a connector 38, such as, for example, one of a male connector and a female connector. Another cable 40 may be connected on its first end to electronic service tool 18, and on its second end to a connector 42, which may include the other of the male connector and the female connector. Connectors 38 and 42 be joined to link cables 36 and 40. Through cables 36 and 40 and connectors 38 and 42, electronic control module 16 may communicate with electronic service tool 18 by, for example, sending and receiving data. Communications standards, including ATA, SAE J1708, SAE J1939, or any other suitable communications standard, may be used to provide the data link between electronic control module 16 and electronic service tool 18. It is also contemplated that a wireless communication link (not shown) may be provided between electronic service tool 18 and electronic control module 16 in place of an actual physical connection between these two devices. Further, electronic service tool 18 may be connected to a plurality of electronic control modules (not shown), and may operate with each electronic control module in the manner described above.

Electronic service tool 18 may include a personal computer, laptop computer, handheld device, or any other suitable electronic computing device. Electronic service tool 18 may include a microprocessor 44, memory 46, and software 48. Software 48 may include programs, procedures, and/or instructions for telling electronic service tool 18 what tasks it should perform. Electronic service tool 18 may also include a user interface including a visual display 50 for conveying information, and a keyboard 52 for inputting data. Preferably, electronic service tool 18 may be portable so that it may be carried to different sites.

A user, such as, for example, a field technician, technical communicator, product engineer, or customer, may connect electronic service tool 18 to electronic control module 16 via interlock 20 to communicate with and/or control the operation of electronic control module 16. For example, when the connection is made, electronic service tool 18 may download data from electronic control module 16. The data may include individual fault codes or fault logs stored in memory 32. Electronic service tool 18 may store the data in its own memory 46, and may also display the fault codes on visual display 50 where they may be viewed by the service technician. By reviewing the fault codes and fault logs, the service technician may be able to identify hard faults and shorts in electrical system 12. Based at least in part on this information, the service technician may repair or replace wiring 24, electrical connectors 26, electrical components 22, and parts of sensor array 34 that may have been damaged or broken. Additionally, one of electronic service tool 18 and electronic control module 16 may ping the other to make sure they are connected. When the pinging ceases, electronic service tool 18 and electronic control module 16 may recognize that they are no longer connected.

Visual display 50 may include, for example, a computer screen or monitor, one or more light emitting diodes, a touchscreen, or any other suitable display device. The fault codes may appear on visual display 50 as text and/or images. It is also contemplated that electronic service tool 18 may include an audio mechanism 54 configured to generate an auditory alert informing the service technician that a fault code has been reported by electronic control module 16.

Using a keyboard 52 or any other suitable input device known in the art, the service technician may input text, characters, and other data into electronic service tool 18 for controlling its operation. Electronic service tool 18 may also include a wiggle test mode activator 56. When the service technician actuates wiggle test mode activator 56, then, under predefined conditions, electronic service tool 18 may instruct electronic control module 16 to enter a wiggle test mode. It is contemplated that a user may start the wiggle test mode by pressing a key or combination of keys on keyboard 52. Additionally or alternatively, wiggle test mode activator 56 may be a virtual button displayed on visual display 50 that a user may click or select using a mouse (not shown) or similar input device. It is also contemplated that a user may start the wiggle test mode by selecting the mode from a drop-down toolbar or menu on visual display 50.

After the service technician starts the wiggle test mode, electronic control module 16 may disable the enable conditions and modify the trip conditions in its diagnostic algorithms. For example, a ten second trip delay may be reduced to 0.25 seconds. Reducing trip delay times may allow electronic control module 16 to rapidly identify faults or shorts, thus making electronic control module 16 more sensitive to intermittent faults and shorts in electrical system 12. Generally, trip threshold values may be consistent between the normal test mode and the wiggle test mode. However, the trip delays in the normal test mode may differ from those in the wiggle test mode. In one embodiment, the trip delays in the normal test mode may be longer in duration than those in the wiggle test mode. Additionally or alternatively, the act of disabling enable conditions and modifying trip conditions for the wiggle test mode may be limited to a first part of electrical system 12, while enable conditions and trip conditions for a second part of electrical system 12 may remain unchanged. In such an embodiment, the first portion may be tested for intermittent faults using the wiggle test mode, while the second portion may be tested for hard faults using the normal test mode. Similarities and differences between the normal test mode and the wiggle test mode will be discussed in greater detail below.

The predefined conditions may be selected so as to prevent the wiggle test mode from being entered if machine 14 is in a state in which the wiggle test mode may return inaccurate results. An example of a predefined condition may be that electronic service tool 18 and electronic control module 16 must be connected. If they are not, then the wiggle test mode cannot be entered. Also, a predefined condition may require that an engine (not shown) of machine 14 is off, or that the engine speed is zero, in order for the wiggle test mode to be entered. One reason for this is that engine vibrations may cause intermittent faults to occur at multiple places in electrical system 12, making them harder to identify. Turning the engine off may eliminate the engine vibrations, and thus, intermittent faults may be directly linked to the electrical component being wiggled. Accordingly, the service technician may pinpoint intermittent faults with greater ease. That predefined condition may also require that an ignition key be turned to its "on" position so that electronic control module 16 may receive electrical power while the engine is off. For transmission controls (not shown), a predefined condition for entering the wiggle test mode may be that a parking brake must be set before the wiggle test mode can be entered. Additionally or alternatively, a predefined condition may be that a transmission of the engine (not shown) must be in neutral. It should be understood that the requirements of the predefined conditions may be application dependent, and more or other predefined conditions may be used.

Figure 3:
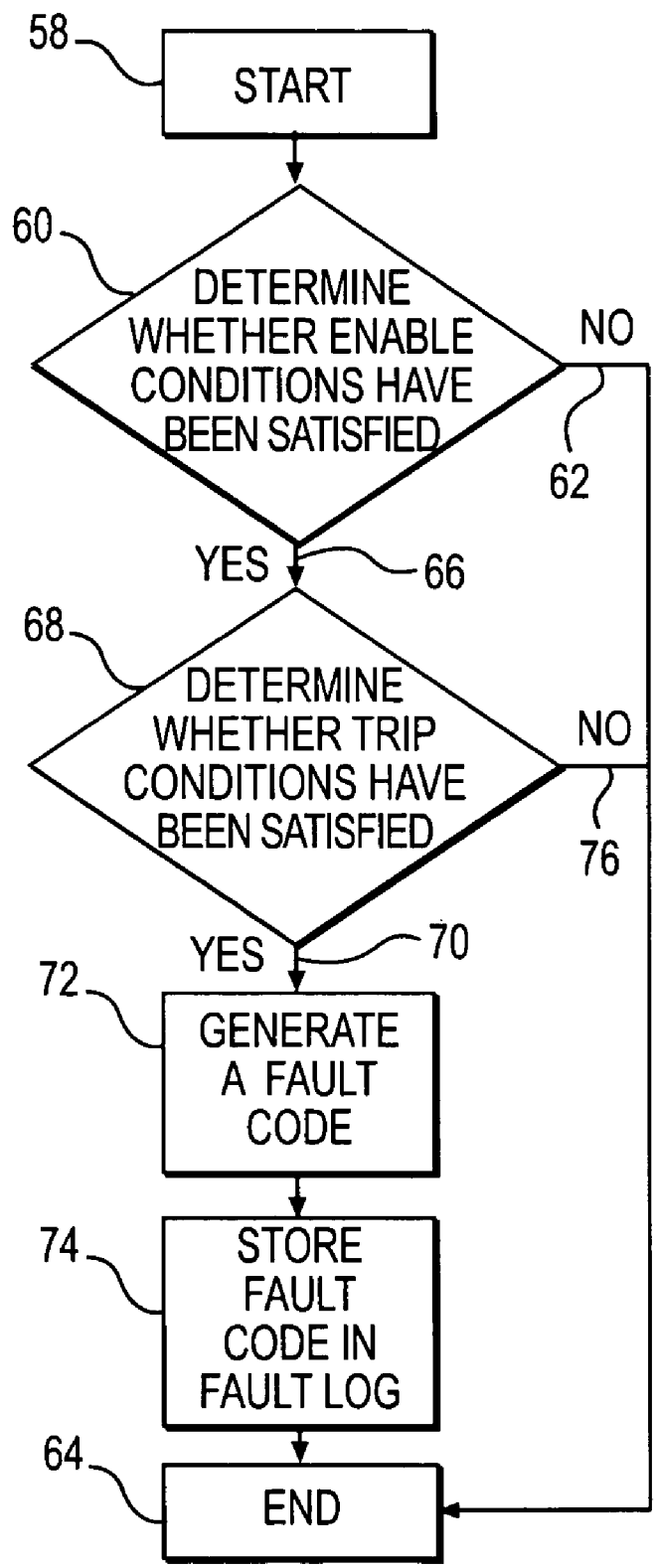
FIG. 3 is a flow diagram of a method for identifying electrical faults according to an exemplary disclosed embodiment of the present disclosure.

Referring to FIG. 3, electronic control module 16 may begin (step 58) diagnosing and identifying faults in electrical system 12 by determining whether the enable conditions have been satisfied (step 60). If the enable conditions have not been satisfied (step 62: NO), the process may end (step 64). If the enable conditions have been satisfied (step 66: YES), then electronic control module 16 may monitor electrical system 12 using sensor array 34 to determine whether any faults or shorts in electrical system 12 have satisfied any trip conditions (step 68). If electronic control module 16 finds that a trip condition has been satisfied (step 70: YES), electronic control module 16 may generate a fault code (step 72) that may be stored in the fault log (step 74). At this point the process may end (step 64), or may return to any of steps 58, 60, or 68, so that electronic control module 16 may continue monitoring electrical system 12. If, on the other hand, no trip conditions have been satisfied (step 76: NO), the process may end (step 64), or may repeat from steps 58, 60, or 68, to allow for continued monitoring of electrical system 12.

Figure 4:
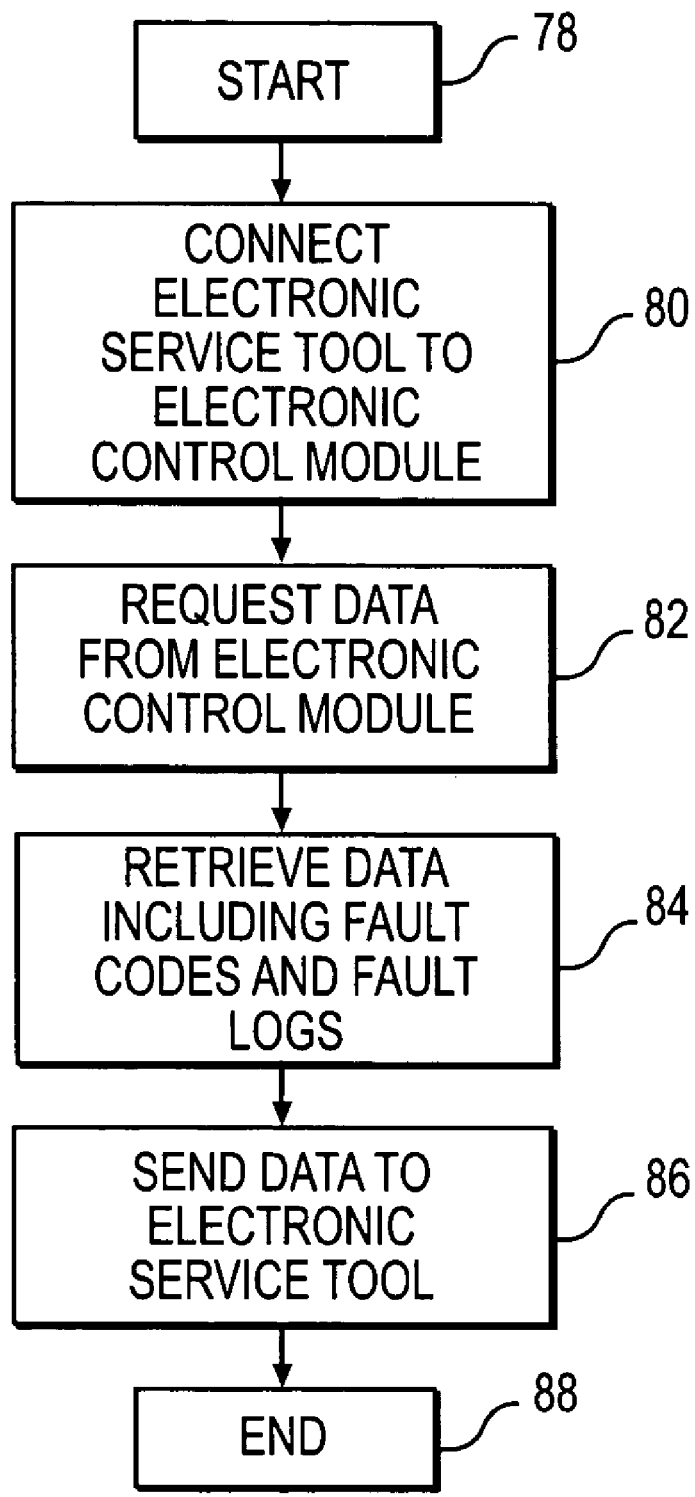
FIG. 4 is a flow diagram of a method for identifying electrical faults according to another exemplary disclosed embodiment of the present disclosure.

Referring now to FIG. 4, electronic service tool 18 and electronic control module 16 may operate in the normal test mode of operation to identify hard faults. Operating electronic service tool 18 and electronic control module 16 in the normal test mode may begin (step 78) with the service technician connecting electronic service tool 18 to electronic control module 16 via interlock 20 (step 80). Once connected, electronic service tool 18 may send a request to electronic control module 16 requesting data pertaining to electrical system 12 (step 82). Upon receiving the request, electronic control module 16 may retrieve the data from its memory 32 (step 84). The data may include, for example, fault logs and fault codes generated using the method shown in FIG. 3. Electronic control module 16 may send the data to electronic service tool 18 via the data link provided by interlock 20 (step 86). Electronic service tool 18 may inform the service technician of faults using visual display 50 or an alarm. Electronic service tool 18 may also store that data in its memory 46. The process may repeat from any of steps 78, 80, 82, or 84, or may terminate (step 88). The service technician may exit from the normal test mode, thus terminating the process, by entering an escape command on keyboard 52, or by disconnecting electronic service tool 18 from electronic control module 16.

Figure 5:
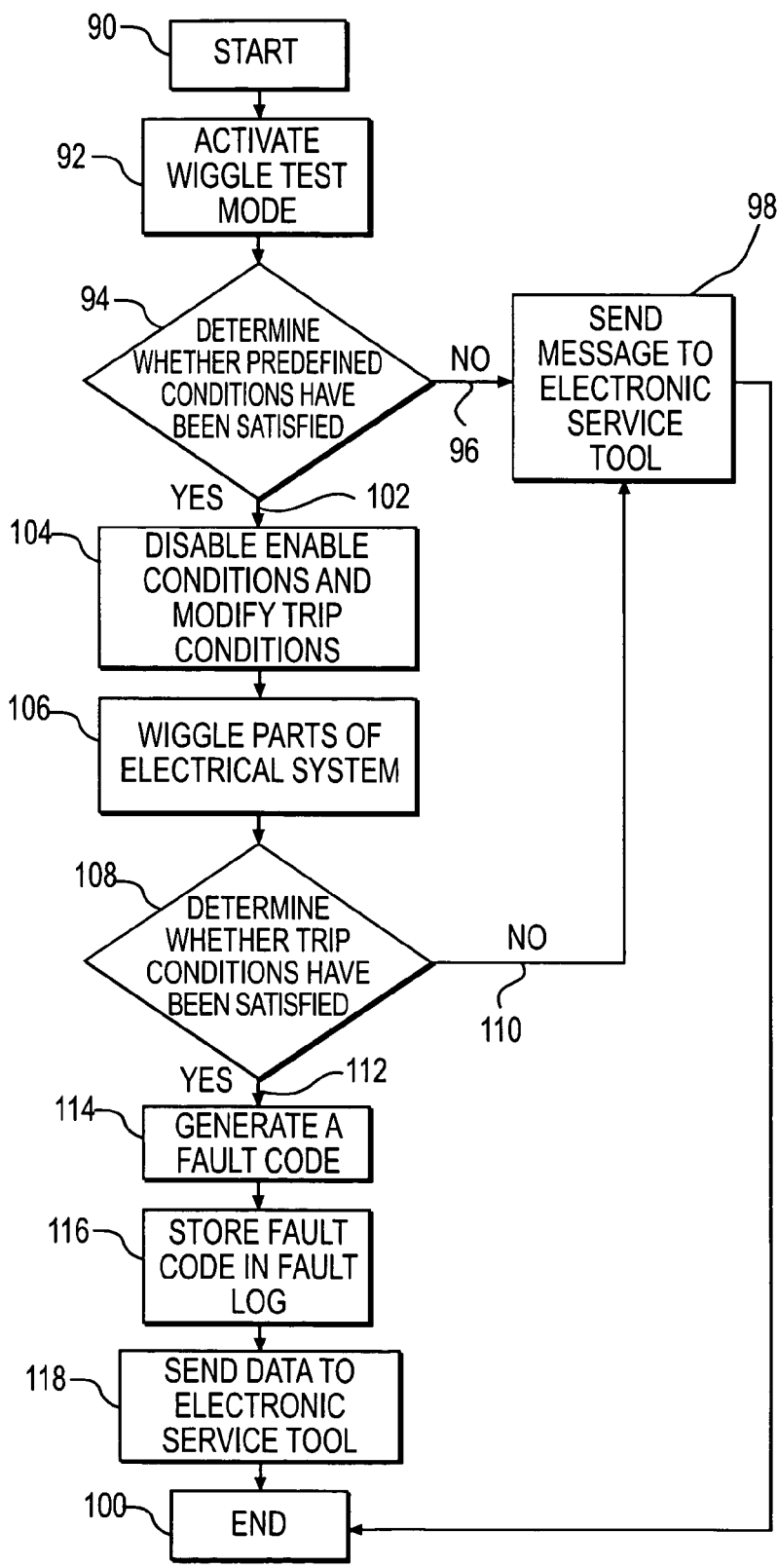
FIG. 5 is a flow diagram of a method for identifying electrical faults according to yet another exemplary disclosed embodiment of the present disclosure.

Referring now to FIG. 5, when electronic service tool 18 and electronic control module 16 are connected, they may also operate in the wiggle test mode. The operation of electronic service tool 18 and electronic control module 16 in the wiggle test mode may begin (step 90) when the service technician activates the wiggle test mode by, for example, actuating the wiggle test mode activator (step 92). Electronic control module 16 may determine whether the predefined conditions for entering the wiggle test mode have been satisfied (step 94). If the predefined conditions have not been satisfied (step 96: NO), then electronic control module 16 may send a message to electronic service tool 18 (step 98) describing why electronic control module 16 will not operate in the wiggle test mode, and the process may end (step 100). The message may include an audible alarm and/or visual message informing the service technician as to why the wiggle test mode could not be entered. If the predefined conditions have been satisfied (step 102: YES), electronic service tool 18 may adjust the fault diagnosis software by disabling the enable conditions and modifying the trip conditions to be more sensitive to intermittent electrical faults (step 104). Then, the service technician may physically wiggle wiring 24, electrical connectors 26, and/or electrical components 22, which may include other electronic control modules, sensors, and/or actuators (step 106). Electronic control module 16 may monitor electrical system 12 to determine if any faults meet the modified trip conditions (step 108). If not (step 110: NO), then electronic control module 16 may inform electronic service tool 18 (step 98) that there are no intermittent faults, and the process may end (step 100). Additionally or alternatively, the process may repeat from any of steps 90, 92, 94, 104, 106, or 108, so that electronic control module 16 may continue to monitor electrical system 12 for intermittent faults.

If electronic control module 16 determines that a modified trip condition has been met (step 112: YES), electronic control module 16 may generate a fault code indicating that an intermittent fault may be present in electrical system 12 (step 114). Electronic control module 16 may store the fault code in a fault log (step 116). Data, including the fault log and fault codes, may be sent to electronic service tool 18 (step 118). When a fault code is sent to electronic service tool 18, the service technician may be informed of the fault using an alarm or using visual display 50, and the process may end (step 100). It is also contemplated that the fault codes may be displayed on visual display 50 in chronological order or according to severity. The service technician may exit from the wiggle test mode by entering an escape command on keyboard 52, selecting an exit or logout function from a toolbar or on-screen menu, disconnecting electronic service tool 18 from electronic control module 16, or by violating one of the predefined conditions.

It is also contemplated that the wiggle test mode may be used without requiring actual wiggling of the electrical components, wiring, or electrical connectors. For example, the service technician may enter the wiggle test mode to circumvent the enable conditions so that the diagnostic algorithms may run and identify faults in electrical system 12. Thus, if for some reason an enable condition cannot be satisfied, the service technician may nevertheless be able to run the diagnostic algorithms by entering the wiggle test mode.

Although an intermittent fault may appear and disappear relatively quickly during the wiggle test mode, a fault code generated by the intermittent fault may latch in electronic service tool 18, remaining visible to the service technician after the intermittent fault has disappeared. However, fault log entries generated during the wiggle test mode may not affect the fault codes and the fault logs generated in the normal test mode. For example, the fault codes and the fault logs generated during the wiggle test mode may be stored in memory locations separate from memory locations used to store the fault codes and fault logs generated during the normal test mode of operation. Furthermore, the fault logs and the fault codes generated in the wiggle test mode may be displayed in an area or window of visual display 50 separate from the area or window displaying the fault codes and the fault logs generated in the normal test mode. If the wiggle test mode is exited or otherwise terminated, the fault logs and fault codes generated in the wiggle test mode may no longer be displayed.

Once the wiggle test mode has begun, it may be terminated for various reasons. One reason may be that a predefined condition that existed when the wiggle test mode began may be violated. For example, if a predefined condition includes a requirement that the engine must be off in order for the wiggle test mode to run, then starting the engine while the wiggle test mode is running may cause the wiggle test mode to terminate. Termination of the wiggle test mode of operation may also occur if the connection between electronic service tool 18 and electronic control module 16 breaks. Once the wiggle test mode terminates, electronic control module 16, the enable conditions, and the trip conditions may return to their unmodified states. Electronic control module 16 and/or electronic service tool 18 may send a message to visual display 50 describing why the wiggle test mode was terminated.

INDUSTRIAL APPLICABILITY

The disclosed system may have applicability with electrical control systems. Apparatus 10 may have particular applicability in identifying electrical faults in an electrical system 12.

A service technician, using an electronic service tool 18, may re-configure the diagnostics in an electronic control module 16 so that it may run in a wiggle test mode. In the wiggle test mode, enable conditions of electronic control module 16 may be disabled, and the sensitivity of trip conditions in electronic control module 16 may be increased. Accordingly, the diagnostics may be capable of identifying intermittent faults as the service technician performs wiggle tests on various elements of electrical system 12. Electronic control module 16 may report the presence of intermittent faults to electronic service tool 18 and the service technician. The service technician may repair or replace the electrical system components causing the problem. Accordingly, intermittent faults may be identified and corrected, which may decrease machine downtime and help to prevent unexpected break-downs.

The wiggle test mode of operation may assist the service technician in isolating and identifying intermittent faults, because the intermittent faults reported by electronic control module 16 may be directly associated with the component being wiggled. Accordingly, unnecessary repairs may be avoided, providing cost savings to service technicians and their customers.

It will be apparent to those skilled in the art that various modifications and variations can be made in the disclosed system and method without departing from the scope of the disclosure. Additionally, other embodiments of the disclosed system and method will be apparent to those skilled in the art from consideration of the specification. It is intended that the specification and examples be considered as exemplary only, with a true scope of the disclosure being indicated by the following claims and their equivalents.

What is claimed is:

1. An apparatus for identifying an electrical fault in an electrical system, the apparatus comprising:
    an electronic service tool configured to instruct an electronic control module to disable an enable condition and modify a trip condition set by the electronic control module, receive electrical system data from the electronic control module as a user wiggles a component of the electrical system, and communicate a fault code to the user when the electrical system data fulfills the modified trip condition.

2. The apparatus of claim 1, wherein the electronic service tool includes software configured to instruct the electronic control module to disable the enable condition and modify the trip condition.

3. The apparatus of claim 1, wherein the trip condition includes a trip threshold and a trip delay, and wherein the trip condition is fulfilled when the trip threshold is achieved for a time period defined by the trip delay.

4. The apparatus of claim 3, where modifying the trip condition includes maintaining the trip threshold and reducing the time period defined by the trip delay.

5. The apparatus of claim 1, further including an interlock, wherein the electronic service tool and the electronic control module are selectively coupled by the interlock.

6. The apparatus of claim 5, wherein uncoupling the electronic service tool from the electronic control module enables the enable condition and unmodifies the trip condition.

7. A method of identifying an electrical fault in an electrical system, the method comprising:
    coupling an electronic service tool to an electronic control module;
    instructing the electronic control module to disable an enable condition and modify a trip condition set by the electronic control module;
    monitoring the electrical system as a user wiggles a component of the electrical system;
    providing the electronic control module with electrical system data;
    generating a fault code when the electrical system data fulfills the modified trip condition; and
    communicating the fault code to the user.

8. The method of claim 7, wherein the electronic control module is instructed upon actuation of a wiggle test mode activator on the electronic service tool.

9. The method of claim 7, wherein the trip condition includes a trip threshold value and a trip delay, and modifying the trip condition includes maintaining the trip threshold and reducing a time period defined by the trip delay.

10. The method of claim 7, further including recording the fault code in a fault log containing a plurality of fault codes, and communicating the fault log to the user.

11. The method of claim 7, wherein communicating the fault code to the user includes at least one of displaying the fault code to the user on a visual display and alerting the user with an auditory alert.

12. The method of claim 7, wherein a predefined condition must be fulfilled before the electronic control module will disable the enable condition and modify the trip condition.

13. The method of claim 12, wherein the predefined condition requires that the electronic control module is connected to the electronic service tool using an interlock.

14. The method of claim 12, wherein violating the predefined condition causes the electronic control module to enable the enable condition and unmodify the trip condition.

15. The method of claim 12, wherein the electrical system is operatively coupled to an engine assembly, and the predefined condition requires that the engine assembly is turned off.

16. The method of claim 7, wherein the electronic control module operates in a normal test mode when the enable condition is enabled and the trip condition is unmodified, and operates in a wiggle test mode when the enable condition is disabled and the trip condition is modified.

17. A method of reconfiguring an on-board diagnostics system to identify electrical faults in an electrical system of a machine, the method comprising:
    switching the on-board diagnostics system from a normal test mode into a wiggle test mode using an electronic service tool;
    wherein the normal test mode, the on-board diagnostics system sets an enable condition and a trip condition to identify a hard fault in the electrical system;
    wherein when the electronic service tool switches the on-board diagnostics system into the wiggle test mode, the enable condition is disabled and the trip condition is modified to identify an intermittent fault in the electrical system.

18. The method of claim 17, wherein the electronic service tool is connected to the on-board diagnostics system by a communications link.

19. The method of claim 17, wherein the trip condition includes a trip delay defining a time period, and wherein switching the on-board diagnostics system into the wiggle test mode includes reducing the time period defined by the trip delay.

20. The method of claim 19, wherein the trip condition includes a trip threshold, and the trip threshold is the same in the normal test mode as it is in the wiggle test mode.

* * * * *